(12) United States Patent
Tsai et al.

(10) Patent No.: US 11,233,324 B2
(45) Date of Patent: Jan. 25, 2022

(54) PACKAGING STRUCTURE AND METHOD FOR FABRICATING THE SAME

(71) Applicant: SILICONWARE PRECISION INDUSTRIES CO., LTD., Taichung (TW)

(72) Inventors: Wen-Jung Tsai, Taichung (TW); Chih-Hsien Chiu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 22 days.

(21) Appl. No.: 16/890,128

(22) Filed: Jun. 2, 2020

(65) Prior Publication Data

US 2021/0328339 A1 Oct. 21, 2021

(30) Foreign Application Priority Data

Apr. 16, 2020 (TW) .................................. 109112808

(51) Int. Cl.
*H01Q 1/52* (2006.01)
*H01L 25/16* (2006.01)
*H01L 21/56* (2006.01)
*H01L 23/482* (2006.01)
*H01L 23/31* (2006.01)

(52) U.S. Cl.
CPC .......... *H01Q 1/526* (2013.01); *H01L 21/561* (2013.01); *H01L 23/3121* (2013.01); *H01L 23/4824* (2013.01); *H01L 25/16* (2013.01)

(58) Field of Classification Search
CPC ............... H01L 21/561; H01L 23/3121; H01L 23/4824; H01L 25/16; H01Q 1/526
See application file for complete search history.

(56) References Cited

U.S. PATENT DOCUMENTS

| 9,431,369 | B2* | 8/2016 | Chih | H01Q 1/2283 |
| 2019/0207304 | A1* | 7/2019 | Kim | H01Q 9/0414 |
| 2019/0280374 | A1* | 9/2019 | Kim | H01L 23/3121 |
| 2019/0287938 | A1* | 9/2019 | Kim | H01L 25/16 |

FOREIGN PATENT DOCUMENTS

CN 102254901 A * 11/2011 ........... H01L 23/552

* cited by examiner

*Primary Examiner* — Allan R Wilson
(74) *Attorney, Agent, or Firm* — Kelly & Kelley, LLP

(57) ABSTRACT

Provided is a packaging structure, which includes a carrier and an electronic component, an antenna module and a connector disposed on the carrier, and a packaging layer encapsulating the electronic component and the connector. A portion of a surface of the connector is exposed from the packaging layer so as to facilitate the electrical connection with a motherboard of an electronic product. A method for fabricating the packaging structure is also provided.

19 Claims, 15 Drawing Sheets

PACKAGING STRUCTURE AND METHOD FOR FABRICATING THE SAME

CROSS-REFERENCE TO RELATED APPLICATIONS

This application claims priority to Taiwan Application Serial No. 109112808, filed on Apr. 16, 2020. The entirety of the above-mentioned patent application is hereby incorporated by reference herein and made a part of this specification.

BACKGROUND

1. Technical Field

The present disclosure relates to a packaging structure and a method for fabricating the same, and more particularly, to a packaging structure having an antenna module and a method for fabricating the same.

2. Description of Related Art

The flourishing of the electronic industries has meant that electronic products are being developed with increasingly more functions and higher performance. At present, the fourth generation (4G) wireless communication technology has been widely used in a myriad of consumer electronic products to facilitate the reception and transmission of various wireless signals.

However, with the rapid development of wireless communication and the increasing network data traffic, the demands for wider wireless transmission bandwidths are growing, which gives rise to the development of the fifth generation (5G) wireless transmission technology.

FIG. 1 is a three-dimensional schematic diagram depicting a conventional wireless communication device. As shown in FIG. 1, the wireless communication device 1 includes: a circuit board 10 provided with electronic components 11, a plurality of chip components 16 disposed on the circuit board 10, an antenna component 12, and an encapsulating body 13. The chip components 16 are disposed on and electrically connected to the circuit board 10. The antenna component 12 is electrically connected with the chip components 16 through a transmission line 17. The encapsulating body 13 encapsulates the chip components 16 and a portion of the transmission line 17.

However, in the conventional wireless transmission device 1, the antenna component 12 used in the 5G wireless transmission needs to be positioned in proximity to the housing of a portable electronic product in order to maximize the signal strengths of the antenna component 12, so there is only limited space available for placing the antenna component 12 within the portable electronic product. This in turn means that the need for miniaturization of the wireless communication device would have to be satisfied. In addition, how the wireless transmission device 1 positioned near the housing electrically communicates with other internal components (e.g., a motherboard) disposed in the center of the portable electronic product also presents a problem to be solved.

Therefore, there is a need for a solution that addresses the aforementioned shortcomings in the prior art.

SUMMARY

In view of the aforementioned shortcomings of the prior art, the present disclosure provides a packaging structure, which comprises: a carrier; an antenna module disposed on the carrier; an electronic component disposed on the carrier; a connector disposed on the carrier; and a packaging layer formed on the carrier and encapsulating the electronic component and the connector, with a portion of a surface of the connector being exposed from the packaging layer.

The present disclosure further provides a method for fabricating a packaging structure, which comprises: providing a carrier configured with an electronic component; disposing a connector on the carrier; and encapsulating the electronic component and the connector by a packaging layer and allowing a portion of a surface of the connector to be exposed from the packaging layer, wherein the carrier is further configured with an antenna module.

In the packaging structure and the method for fabricating the packaging structure above, the carrier has a first side and a second side opposing the first side, and the electronic component and the connector are disposed on the first side, and the antenna module is disposed on the second side.

In the packaging structure and the method for fabricating the packaging structure above, the antenna module and the carrier are combined to form an antenna board.

In the packaging structure and the method for fabricating the packaging structure above, the antenna module may be stacked on the carrier via at least one conductive component.

In the packaging structure and the method for fabricating the packaging structure above, the connector has a port exposed from a side surface of the packaging layer. For example, a plurality of connectors are disposed on the carrier, and the port of each of the connectors is connected to each other, such that after the packaging layer encapsulates the electronic component and the plurality of connectors and a singulation process is performed to cut the packaging layer and separate the plurality of connectors, the port of each of the connectors is exposed from the side surface of the packaging layer. Alternatively, a resist layer is formed on the port of the connector before the electronic component and the connector being encapsulated by the packaging layer, and after a singulation process is performed, the resist layer is removed to expose the port from the side surface of the packaging layer. Alternatively, the port of the connector faces away from the carrier, and before forming the packaging layer, the port is covered with a resist layer or a metal frame.

The packaging structure and the method for fabricating the packaging structure above may further include forming a metal frame on the carrier, and the metal frame covers the connector and is encapsulated by the packaging layer. For example, the metal frame is formed with a receiving space for receiving the connector, and the receiving space is in communication with a side surface of the packaging layer. Furthermore, the receiving space is used as a cutting path, and a singulation process is performed along the cutting path to simultaneously expose the connector and the receiving space from the side surface of the packaging layer. Alternatively, the metal frame is supported on the carrier by a support portion, and the connector is located in the support portion, and then a singulation process is performed to cut along the support portion of the metal frame to simultaneously expose the connector and the receiving space from the side surface of the packaging layer.

The packaging structure and the method for fabricating the packaging structure above further include forming a shielding layer on the packaging layer and connecting the shielding layer to ground.

In summary of the above, in the packaging structure and the method for fabricating the same of the present disclosure, the connector is integrated into the packaging layer with the port of the connector exposed to facilitate electrical connection with a motherboard of an electronic product. Therefore, compared to the prior art, the configuration of the packaging structure of the present disclosure is not limited by the location of the antenna module, and the other components within the electronic product are thus not constrained by space, allowing the electronic product to satisfy the desired functions. Moreover, the electrical energy provided by the motherboard can be directly transmitted into the carrier without going through other electrical transmission paths, thereby enhancing the electrical performance and reducing power loss of the packaging structure.

Furthermore, by integrating the connector into the packaging layer, the antenna module can be positioned close to the housing depending on the signal strength requirements, which efficiently utilizes the internal space of the system end (or the electronic product). Also, unlike the prior art, the packaging layer of the present disclosure can be formed on the entire surface of the carrier. As such, the present disclosure can greatly simplify the fabrication process, thereby significantly lowering the packaging cost and considerably reducing the volume of the packaging structure.

BRIEF DESCRIPTION OF THE DRAWINGS

FIG. 2D' is a portion of three-dimensional diagram of FIG. 2D.

FIG. 2E' illustrates another embodiment of FIG. 2E.

FIG. 4D' illustrates another fabrication method of the package structure shown in FIG. 4D.

FIG. 5D' illustrates another fabrication method of the package structure shown in FIG. 5D.

FIG. 6B' illustrates another embodiment of FIG. 6B.

DETAILED DESCRIPTION

Figure 1:
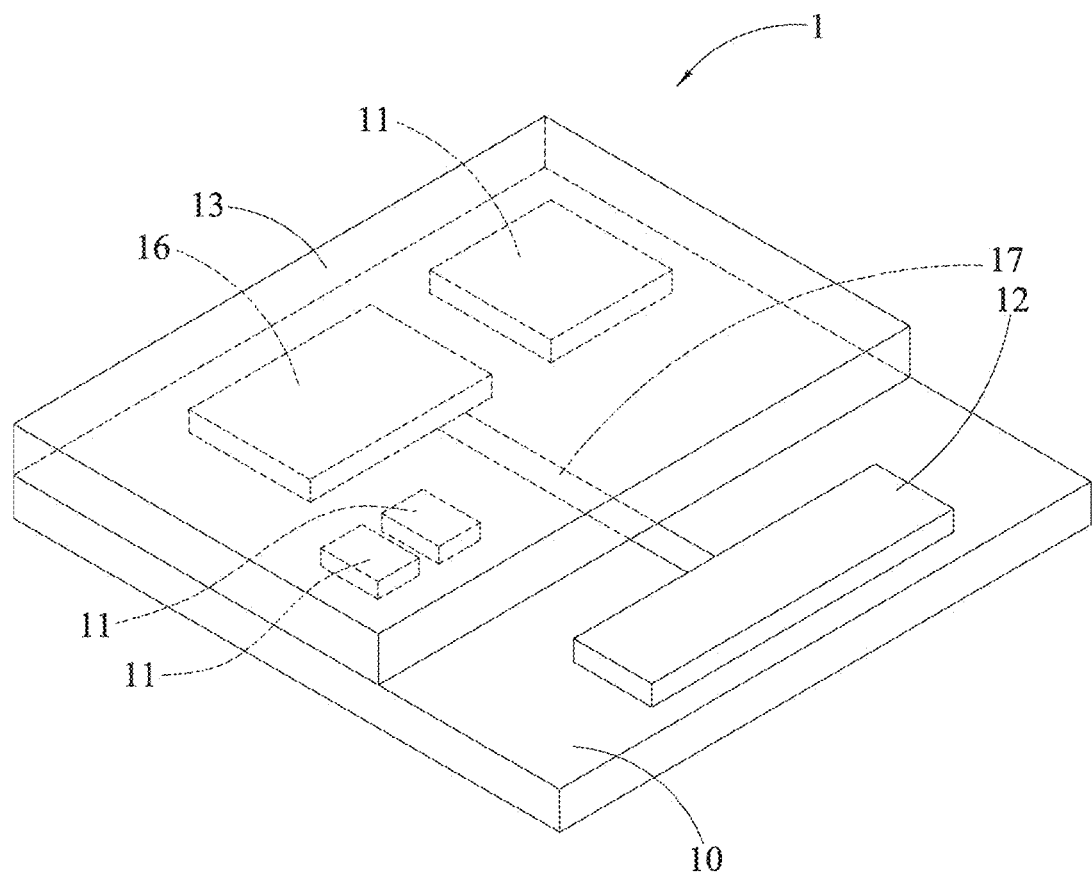
FIG. 1 is a schematic three-dimensional diagram depicting a conventional wireless communication device.

Implementations of the present disclosure are described below by specific embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes only, and are not meant to limit the scope implementable by the present disclosure. Any changes or adjustments made to the relative relationships, without substantially modifying the technical contents, are also to be construed as within the scope implementable by the present disclosure.

FIGS. 2A to 2F are schematic cross-sectional diagrams depicting methods for fabricating packaging structures 2, 2a in accordance with a first embodiment of the present disclosure.

Figure 2A:
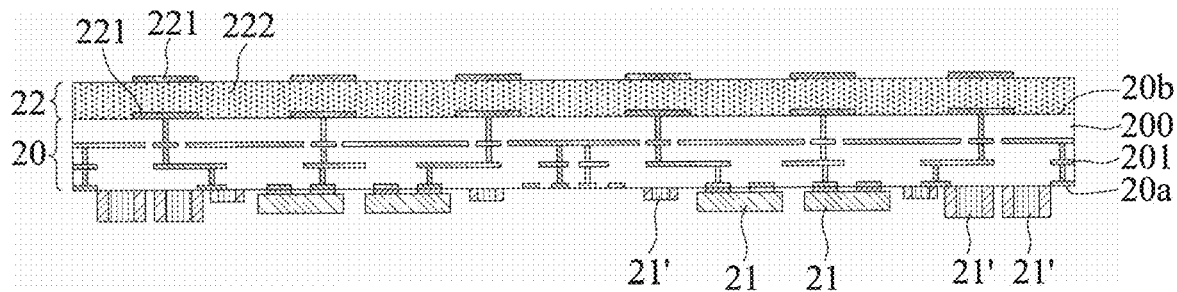
FIGS. 2A to 2E are schematic cross-sectional diagrams depicting methods for fabricating packaging structures in accordance with a first embodiment of the present disclosure.

As shown in FIG. 2A, a carrier 20 is provided. The carrier 20 has a first side 20a and a second side 20b opposite to each other, wherein a plurality of electronic components 21, 21' are disposed on the first side 20a, and an antenna module 22 is disposed on the second side 20b.

In an embodiment, the carrier 20 can be a circuit structure with a core or a coreless circuit structure, such as a packaging substrate. The carrier 20 include at least one insulating layer 200 and a circuit layer 201 (e.g., a redistribution layer [RDL]) provided on the insulating layer 200. Furthermore, the circuit layer 201 can be made of copper, and the insulating layer 200 can be made of a dielectric material, such as polybenzoxazole (PBO), polyimide (PI), a prepreg (PP), or the like. It can be appreciated that the carrier 20 can also be other structures that carry electronic components (e.g., chips), such as a lead frame or a silicon interposer; the present disclosure is not limited as such.

In addition, the electronic components 21, 21' can be active components, passive components, or a combination thereof. Active components can be, for example, semiconductor chips (as shown by the electronic components 21), and passive components (as shown by the electronic components 21') can be, for example, resistors, capacitors and inductors. Specifically, the electronic components 21 are disposed on the carrier 20 and electrically connected to the circuit layer 201 in a flip-chip manner. Alternatively, the electronic components 21 can be electrically connected to the circuit layer 201 via a plurality of solder wires (not shown) in a wire-bonding manner. However, the ways in which the electronic components are electrically connected to the carrier are not limited to those described above.

Furthermore, the antenna module 22 comprises an insulating body 222 combined onto the second side 20b of the carrier 20 and at least one antenna body 221 combined to the insulating body 222. The material of the insulating body 222 can be, for example, polyimide (PI), a dry film, an epoxy, a molding compound, or the like; the present disclosure is not limited these. Specifically, the carrier 20 and the antenna module 22 combine to form an antenna board (e.g., the antenna module 22 is contact bonded onto the carrier 20), and the antenna body 221 is a millimeter-wave antenna that is disposed on the two opposite sides of the insulating body 222 to form a coupled antenna (but the aspects of the antenna body 221 is not limited to this).

Figure 2B:
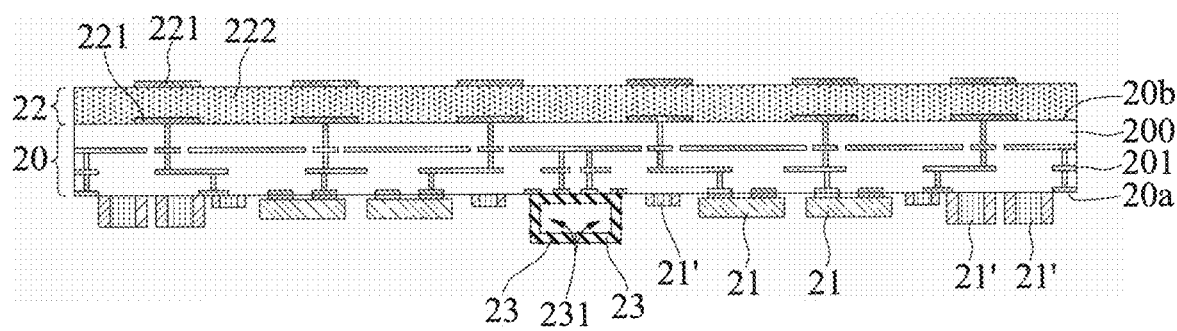

As shown in FIG. 2B, at least one connector 23 is disposed on the first side 20a of the carrier 20.

In an embodiment, the quantity of the connector 23 is at least two, and the connector 23 has a port 231. For example, any two connectors 23 are arranged on the first side 20a of the carrier 20 in a way such that their ports 231 face each other. Specifically, an enclosed chamber is formed by the ports 231 of the pair of docking connectors 23.

Figure 2C:
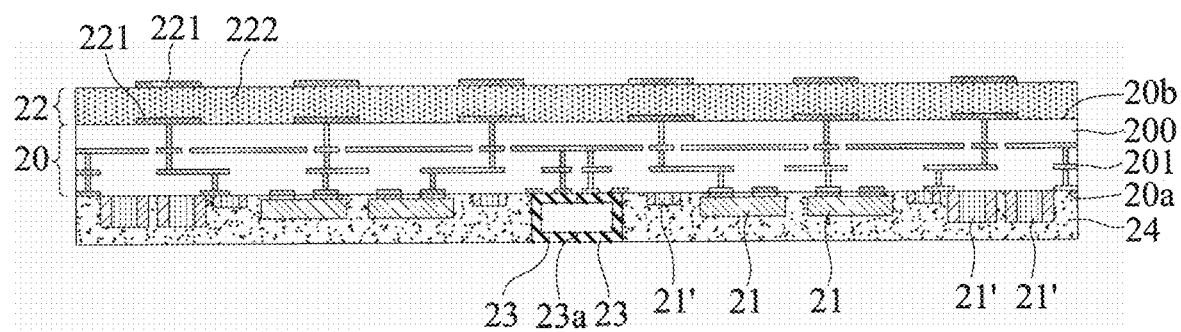

As shown in FIG. 2C, a packaging layer 24 is formed on the first side 20a of the carrier 20 to encapsulate the electronic components 21, 21' and the connectors 23.

In an embodiment, the packaging layer 24 can be an insulating material, such as polyimide, a dry film, an epoxy or a molding compound, which can be formed on the carrier 20 by lamination or molding.

Figure 2D:
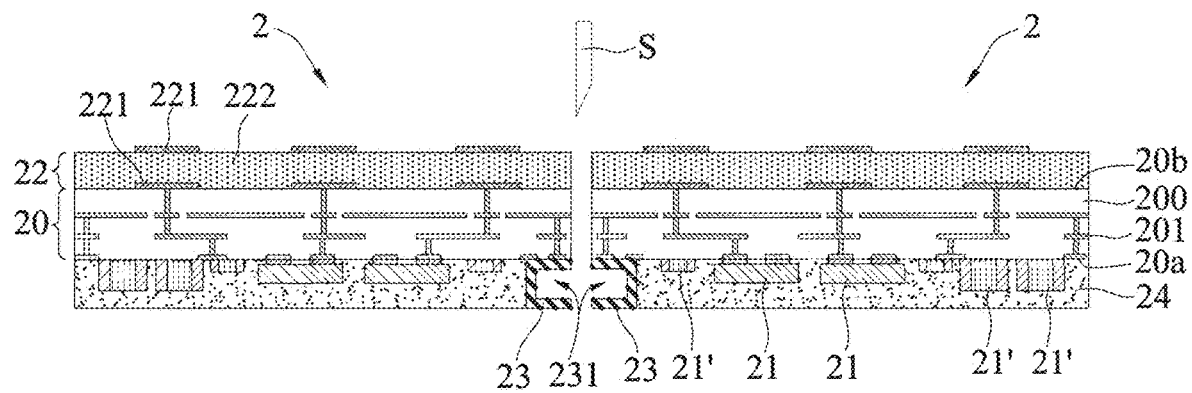
Figure 2D:
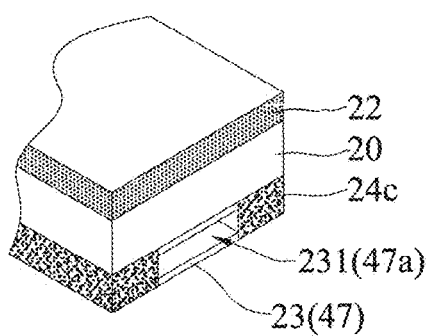

As shown in FIGS. 2D and 2D', a singulation process S is performed along cutting paths to obtain a plurality of packaging structures 2, and a portion of the surface of the connector 23 is exposed from a side surface 24c of the packaging layer 24.

In an embodiment, the cutting path of the singulation process S corresponds to interfaces 23a of the ports 231 of the connectors 23 (as shown in FIG. 2C), which separates the two connectors 23 and allows the ports 231 of the connectors 23 to be exposed from the side surfaces 24c of the packaging layers 24.

Figure 2E:
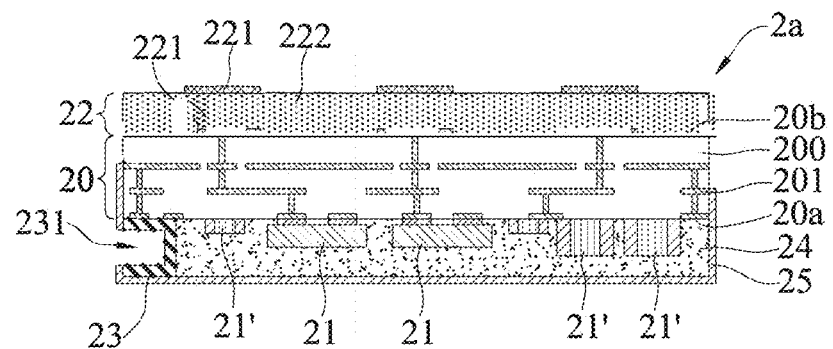
Figure 2E:
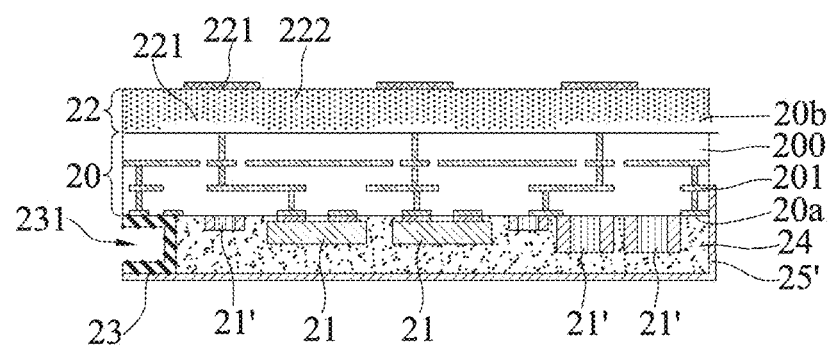

As shown in FIG. 2E, depending on the electromagnetic interference (EMI) requirements of the packaging structure 2, a shielding layer 25 is formed on the surface of the packaging layer 24, and the shielding layer 25 is also in contact with the circuit layer 201 for grounding, wherein the shielding layer 25 does not cover the port 231 of the connector 23, thereby forming another packaging structure 2a. Alternatively, as shown in FIG. 2E', before the shielding layer 25' is formed, a mask can be formed first (not shown) on the port 231 of the connector 23. The mask is then removed after the shielding layer 25' is formed, such that the shielding layer 25' does not cover the edges of the port 231 of the connector 23.

In an embodiment, the shielding layer 25 can be formed by, for example, sputtering, vaporing, electroplating, electroless plating, chemical plating, foiling, etc., and the present disclosure is not limited as such.

Figure 2F:
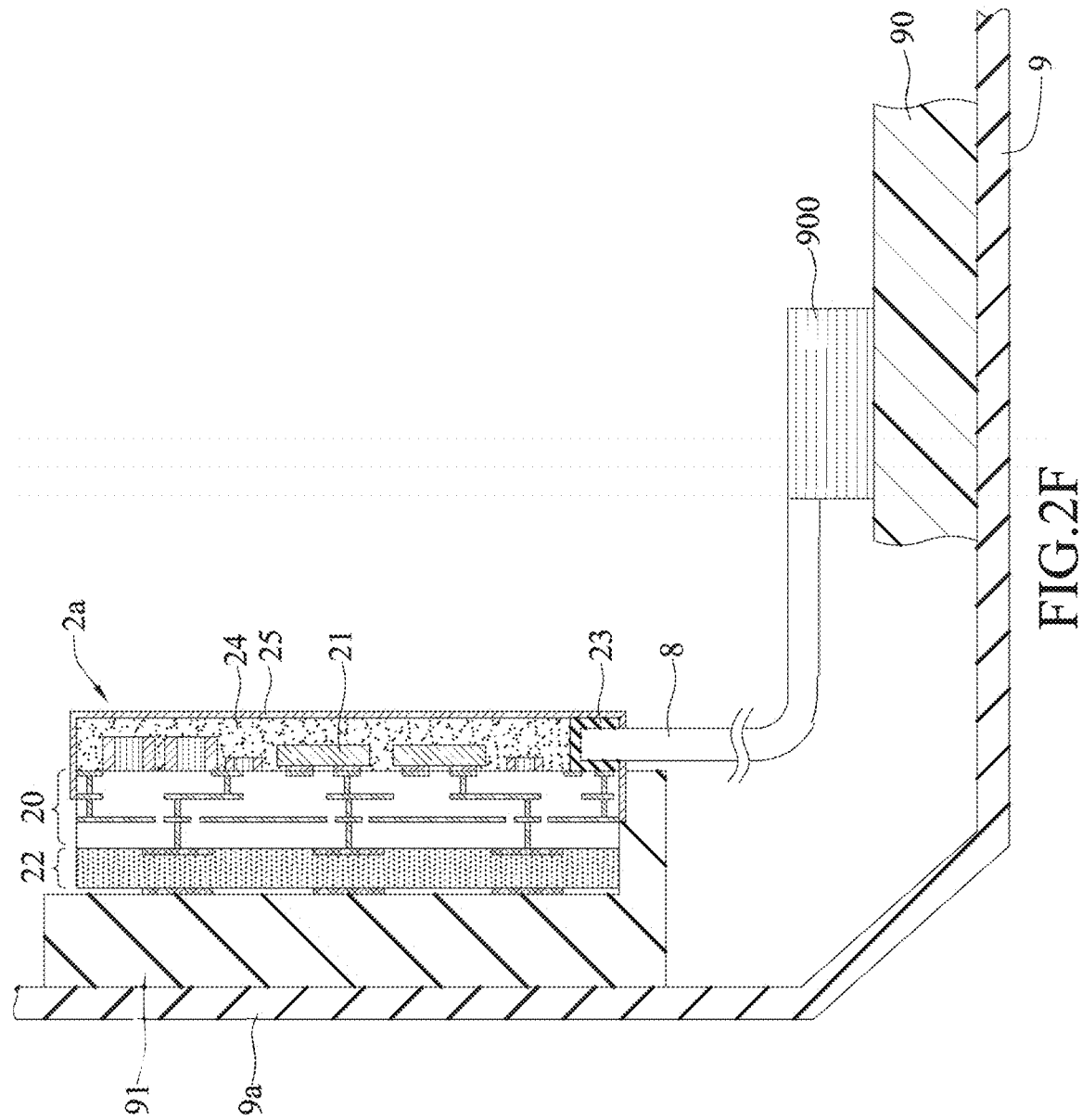
FIG. 2F is a schematic cross-sectional diagram of a subsequent application of the packaging structure of FIG. 2E.

In a subsequent application of the packaging structure 2, 2a, for example, as shown in FIG. 2F, the connector 23 is electrically connected to a connection port 900 of a motherboard 90 of an electronic product 9 (e.g., a smartphone) via a transmission cable or a transmission accessories 8 of a flexible circuit board, and the packaging structure 2, 2a is integrated into the electronic product 9 through a support 91. It can be appreciated that the packaging structure 2, 2a can be arranged depending on the space available inside the electronic product 9. For example, depending on the requirements for signal strength, the antenna module 22 of the packaging structure 2, 2a can be arranged in proximity to a housing 9a.

FIGS. 3A to 3G are schematic cross-sectional diagrams depicting a method for fabricating a packaging structure 3a in accordance with a second embodiment of the present disclosure. The present embodiment is different from the first embodiment mainly in the arrangements of the carrier and the antenna module, and the rest of the fabrication processes are similar and will thus be omitted below.

Figure 3A:
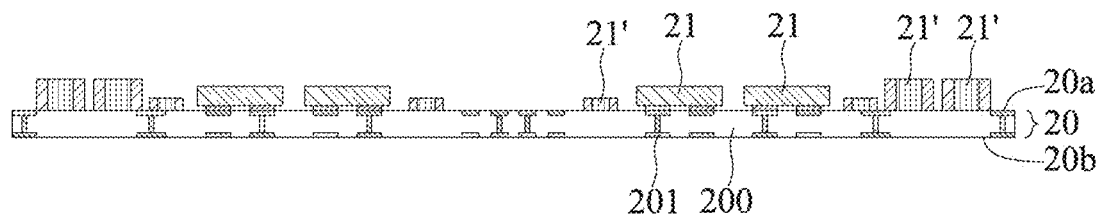
FIGS. 3A to 3G are schematic cross-sectional diagrams depicting methods for fabricating packaging structures in accordance with a second embodiment of the present disclosure.
Figure 3B:
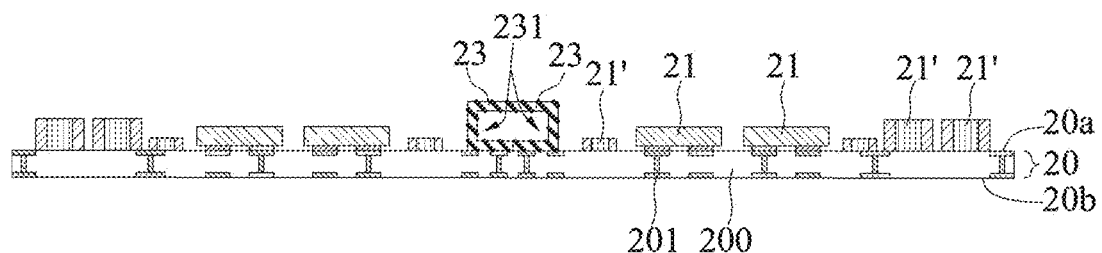

As shown in FIGS. 3A and 3B, a plurality of electronic components 21, 21' are provided on a first side 20a of a carrier 20, and at least one connector 23 is further provided on the first side 20a of the carrier 20 (two connectors 23 are shown for illustration purposes in this embodiment).

Figure 3C:
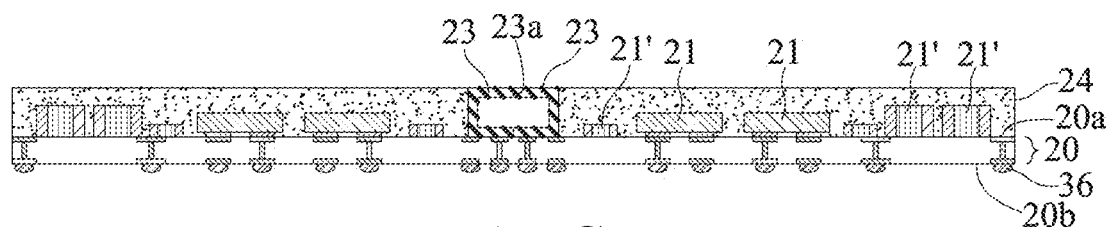

As shown in FIG. 3C, a packaging layer 24 is formed on the first side 20a of the carrier 20 to encapsulate the electronic components 21, 21' and the connectors 23, and a plurality of conductive components 36 electrically connected to the circuit layer 201 are formed on the second side 20b of the carrier 20.

In an embodiment, the conductive components 36 can be solder balls, copper-core balls, metal (e.g., copper or gold) components (e.g., pillars, blocks or pins), or other types of suitable components.

Figure 3D:
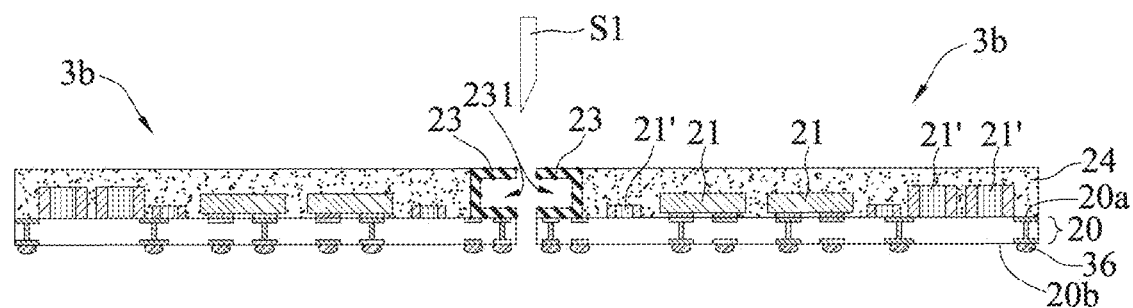

As shown in FIG. 3D, a first singulation process S1 is performed, such that ports 231 of the connectors 23 are exposed from side surfaces 24c of the packaging layers 24 to obtain a plurality of interposer structures 3b (referring to FIG. 2D').

Figure 3E:
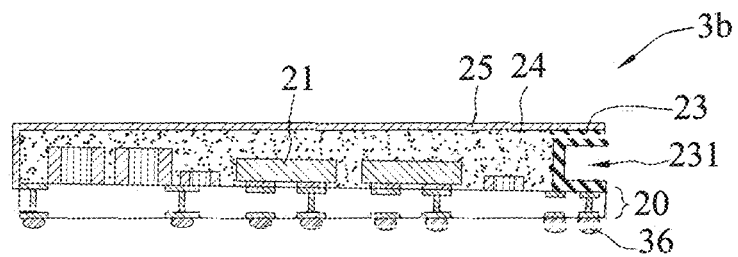

As shown in FIG. 3E, depending on the needs, a shielding layer 25 is formed on the packaging layer 24. The shielding layer 25 is arranged to be in contact with the circuit layer 201 for grounding, wherein the shielding layer 25 does not cover the port 231 of the connector 23.

Figure 3F:
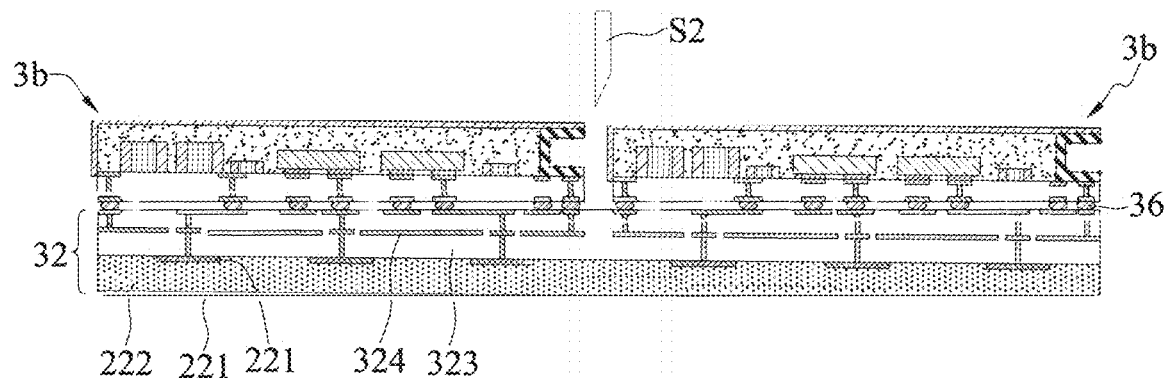

As shown in FIG. 3F, the interposer structures 3b are combined and electrically connected with an antenna module 32 via conductive components 36 of the interposer structures 3b.

In an embodiment, the antenna module 32 is in the form of an antenna board, which includes an antenna body 221, an insulating body 222, a base 323, and a circuit portion 324. For example, the base 323 is a board, one side of which is combined with the conductive components 36, while the other side is combined with the antenna body 221 and the insulating body 222. For example, the base 323 can be made from a dielectric material, such as PBO, PI, a PP, etc. The circuit portion 324 can be a RDL arranged in the base 323. The base 323 and the circuit portion 324 can constitute a circuit structure with a core or a coreless circuit structure, such as a packaging substrate.

Figure 3G:
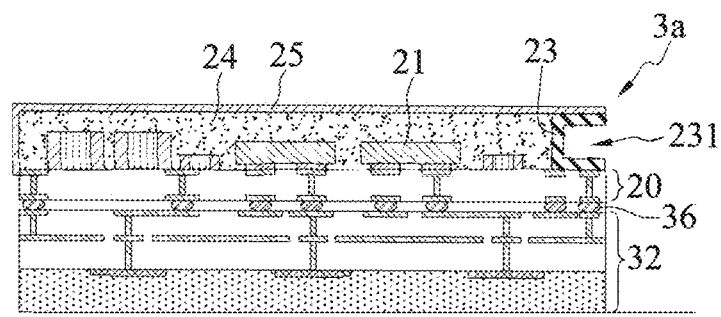

As shown in FIG. 3G, a second singulation process S2 is performed along the cutting path shown in FIG. 3F, thereby obtaining a packaging structure 3a of the present disclosure.

Figure 3H:
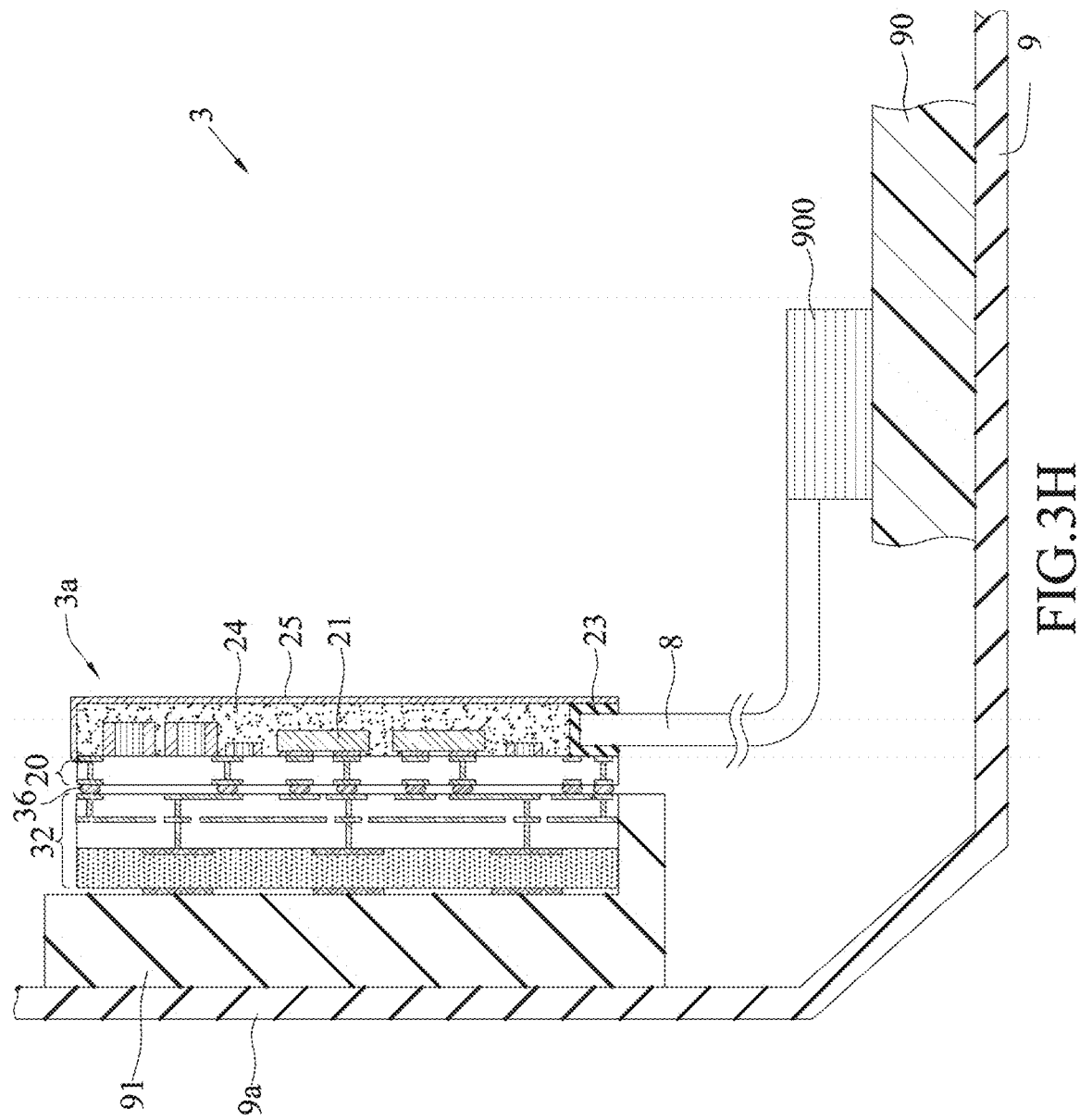
FIG. 3H is a schematic cross-sectional diagram of a subsequent application of the packaging structure of FIG. 3G.

In a subsequent application of the packaging structure 3a, as shown in FIG. 3H, the connector 23 is electrically connected to a connection port 900 of a motherboard 90 of an electronic product 9 (e.g., a smartphone) via a transmission cable or a transmission accessories 8 of a flexible circuit board, and the packaging structure 3a is integrated into the electronic product 9 through a support 91, and the antenna module 32 of the packaging structure 3a can be arranged in proximity to a housing 9a.

FIGS. 4A to 4F are schematic cross-sectional diagrams depicting methods for fabricating packaging structures 4, 4a in accordance with a third embodiment of the present disclosure. The present embodiment is different from the first embodiment mainly in the arrangement of the connector, and the rest of the fabrication processes are similar and will thus be omitted below.

Figure 4A:
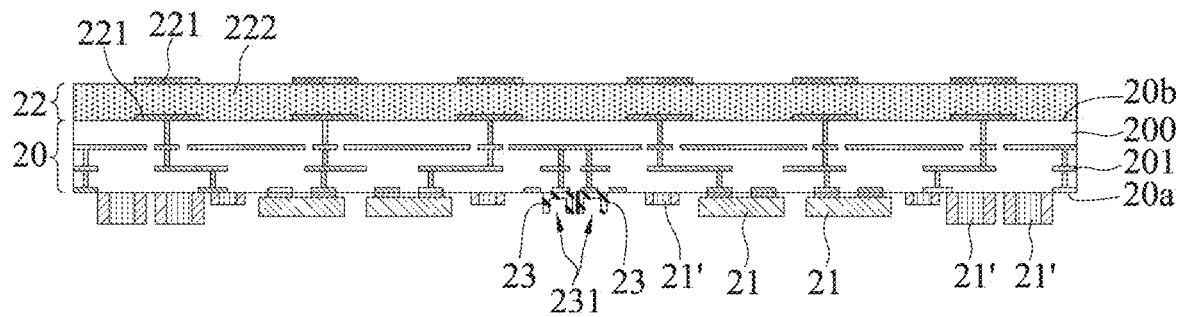
FIGS. 4A to 4E are schematic cross-sectional diagrams depicting methods for fabricating packaging structures in accordance with a third embodiment of the present disclosure.

As shown in FIG. 4A, a carrier 20 is provided. A plurality of electronic components 21, 21' and a plurality of connectors 23 are provided on a first side 20a of the carrier 20, and an antenna module 22 is provided on the second side 20b thereof.

In an embodiment, the connectors 23 are arranged in a way such that their ports 231 are facing away from the first side 20a of the carrier 20. For example, the connectors 23 are arranged side by side at an interval on the first side 20a of the carrier 20.

Figure 4B:
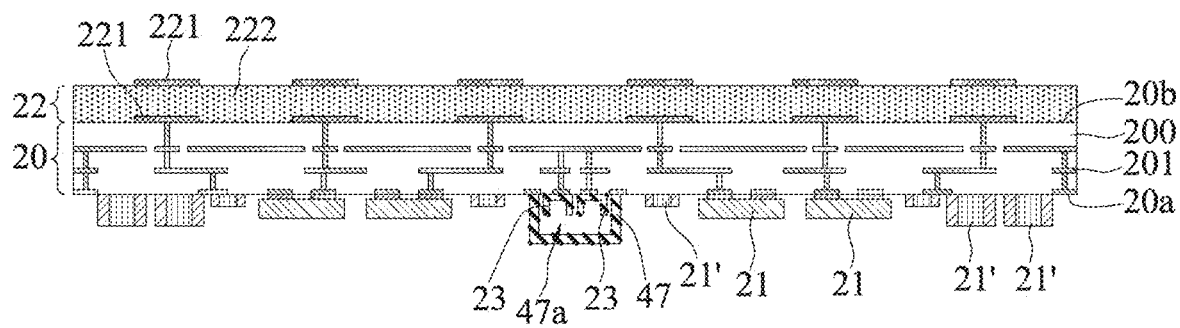

As shown in FIG. 4B, a metal frame 47 is arranged on the first side 20a of the carrier 20 in a way such that the metal frame 47 covers the connectors 23. The metal frame 47 includes a receiving space 47a for receiving the connectors 23.

In an embodiment, the metal frame 47 can be an iron plate that covers the periphery of the connectors 23. The receiving space 47a has a concave shape to facilitate enclosure of the connectors 23.

Figure 4C:
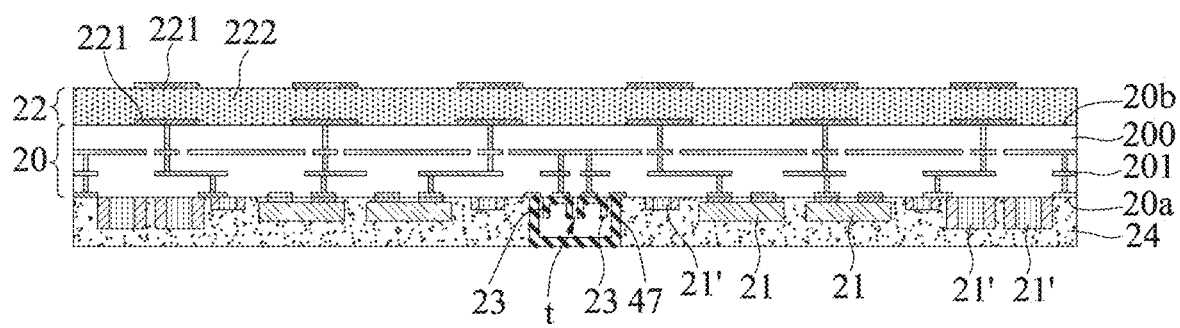

As shown in FIG. 4C, a packaging layer 24 is formed on the first side 20a of the carrier 20 to encapsulate the electronic components 21, 21' and the metal frame 47.

Figure 4D:
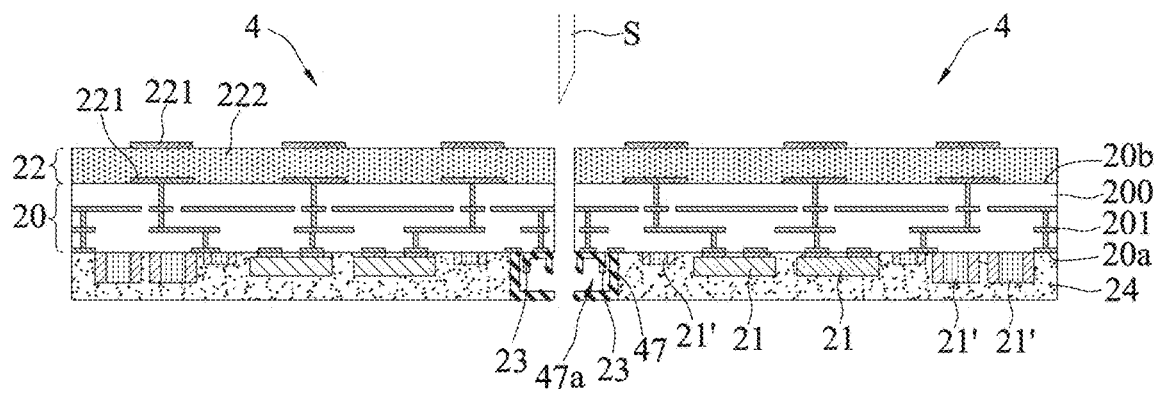
Figure 4D:
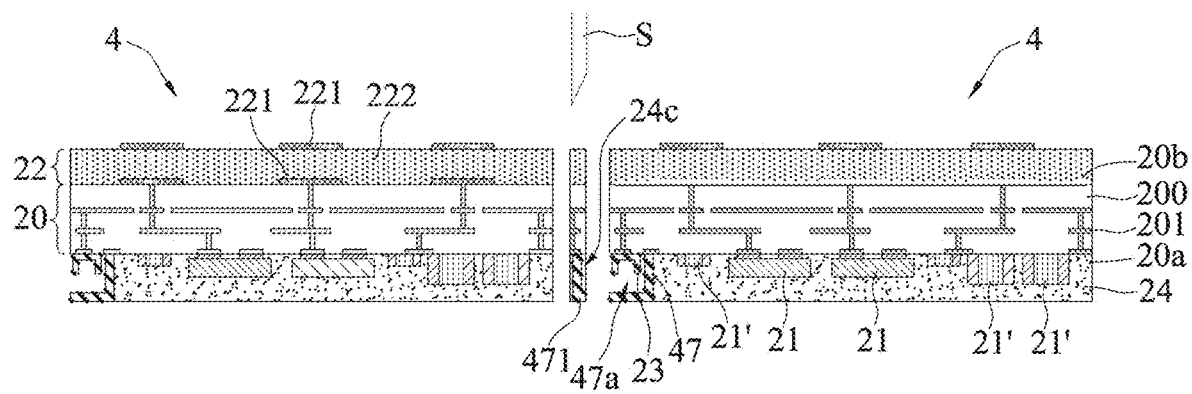

As shown in FIG. 4D, a singulation process S is performed using the receiving space 47a as a cutting path, so that the receiving space 47a of the metal frame 47 is in communication with the side surface of the packaging layer 24 (referring to FIG. 2D'). With the arrangement of the metal frame 47, the connectors 23 can be prevented from being encapsulated by the packaging layer 24, such that the connectors 23 can be exposed from the side surfaces of the packaging layer 24.

In an embodiment, the cutting path of the singulation process S corresponds to the interval t between each of the connectors 23 (as shown in FIG. 4C). Thus, a plurality of packaging structures 4 each including a metal frame 47 and a connector 23 are obtained, wherein the connectors 23 and the receiving spaces 47a of the metal frames 47 are simultaneously exposed from the side surface of the packaging layers 24.

In addition, the metal frame 47 is supported on the carrier 20 via support portions 471 of the metal frame 47. The support portions 471 define the receiving spaces 47a, and the connectors 23 are located in the support portions 471. As shown in FIG. 4D', in another embodiment, depending on the needs of the product functions, the receiving spaces 47a are used as a cutting path, and during a singulation process S cutting along the cutting path, one of the sides of the metal frame 47 can be cut (e.g., cutting is performed along one of the support portions 471 of the metal frame 47), thereby simultaneously obtaining a plurality of packaging structures 4 having the metal frames 47 and the connectors 23, and the connectors 23 and the receiving spaces 47a of the metal frames 47 are simultaneously exposed from the side surfaces 24c of the packaging layers 24.

Figure 4E:
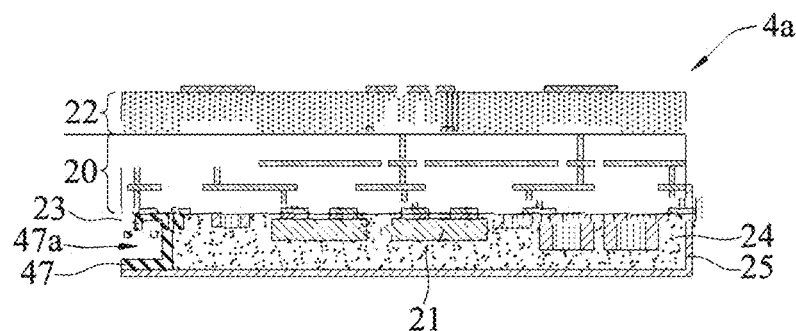

As shown in FIG. 4E, depending on the needs, a shielding layer 25 for grounding the circuit layer 201 is formed on the packaging layer 24, and the shielding layer 25 does not cover the connector 23 and the receiving space 47a of the metal frame 47, thereby obtaining another packaging structure 4a.

Figure 4F:
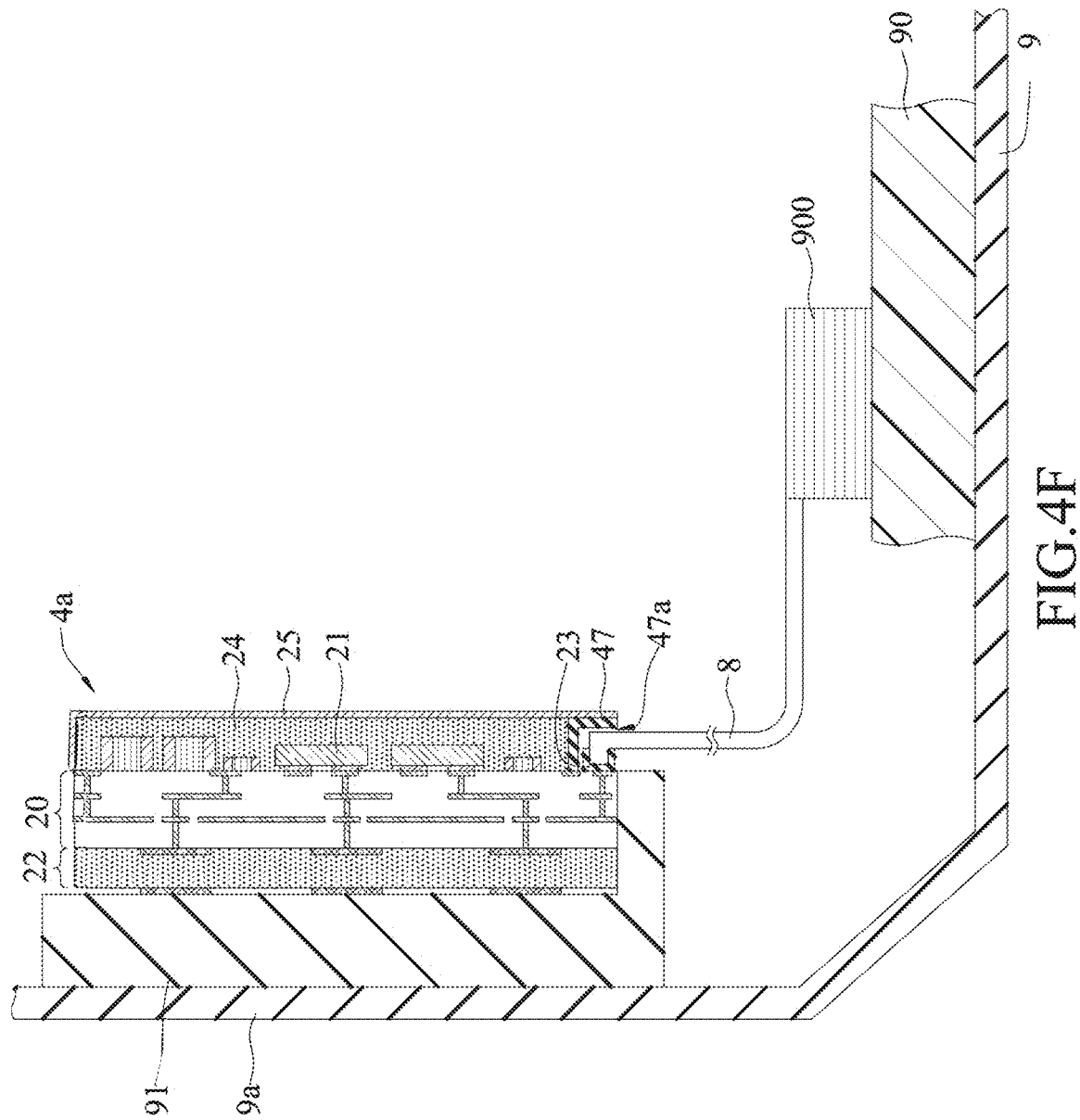
FIG. 4F is a schematic cross-sectional diagram of a subsequent application of the packaging structure of FIG. 4E.

In a subsequent application of the packaging structure 4, 4a, as shown in FIG. 4F, the connector 23 is electrically connected to a connection port 900 of a motherboard 90 of an electronic product 9 (e.g., a smartphone) via a transmission cable or a transmission accessories 8 of a flexible circuit board, and the packaging structure 4, 4a is integrated into the electronic product 9 through a support 91, and the antenna module 22 of the packaging structure 4, 4a can be arranged in proximity to a housing 9a.

FIGS. 5A to 5G are schematic cross-sectional diagrams depicting a method for fabricating a packaging structure in accordance with a fourth embodiment of the present disclosure. The present embodiment is different from the second embodiment mainly in the arrangement of the antenna module, and the rest of the fabrication processes are similar and will thus be omitted below.

Figure 5A:
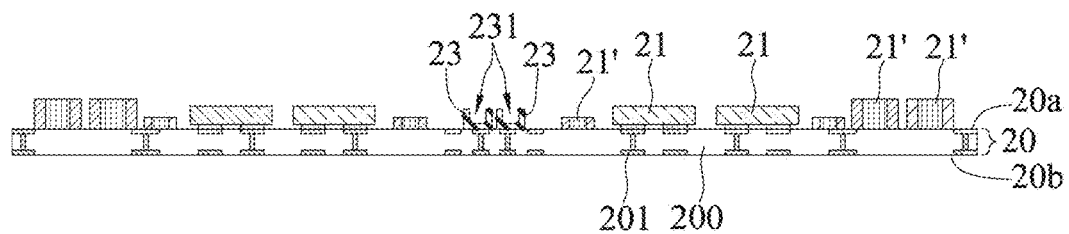
FIGS. 5A to 5G are schematic cross-sectional diagrams depicting methods for fabricating packaging structures in accordance with a fourth embodiment of the present disclosure.
Figure 5B:
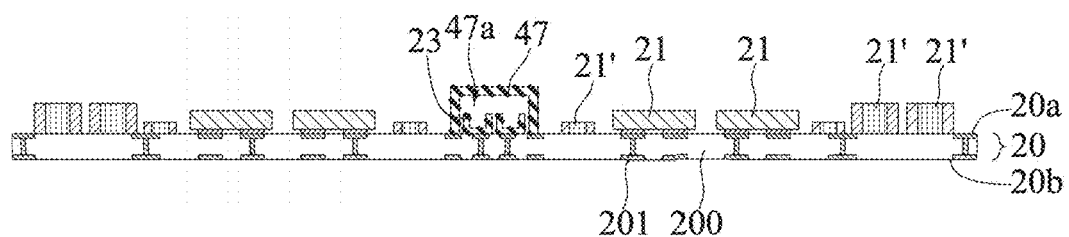

As shown in FIGS. 5A and 5B, a plurality of electronic components 21, 21', connector 23, and a metal frame 47 are provided on a first side 20a of a carrier 20.

Figure 5C:
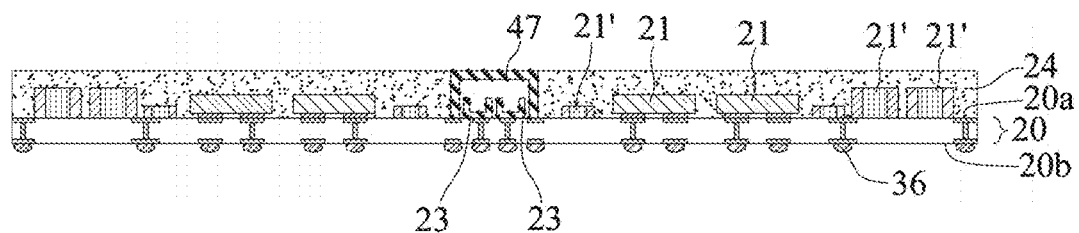

As shown in FIG. 5C, a packaging layer 24 is formed on the first side 20a of the carrier 20 to encapsulate the electronic components 21, 21' and the metal frame 47, and a plurality of conductive components 36 electrically connected to the carrier 20 are formed on the second side 20b of the carrier 20.

Figure 5D:
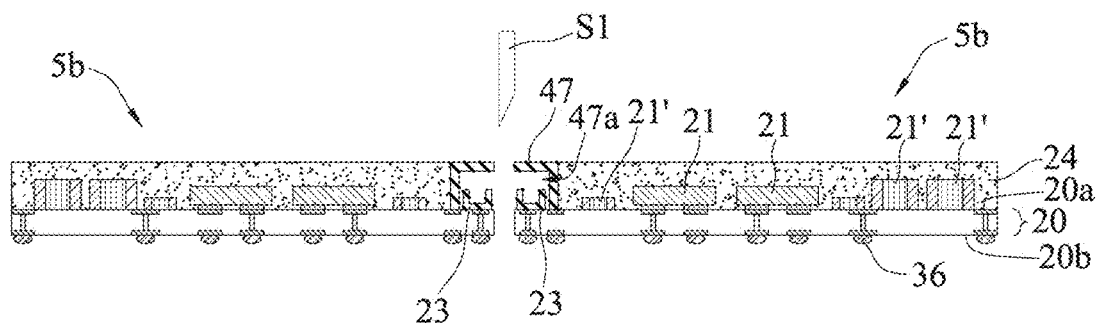
Figure 5D:
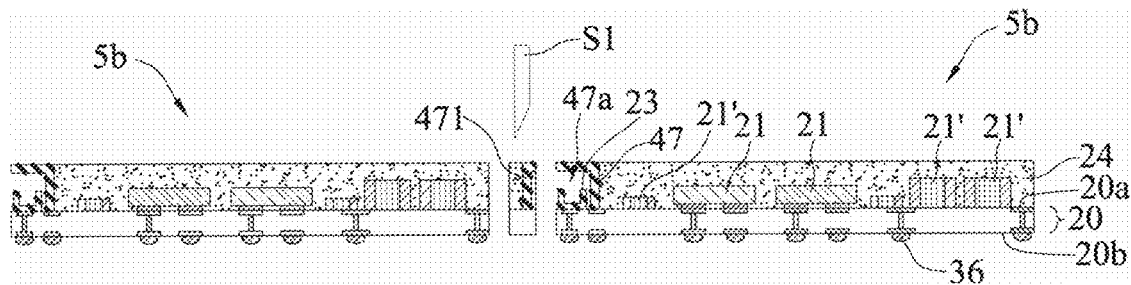

As shown in FIG. 5D, a first singulation process S1 is performed to divide the metal frame 47, such that the receiving spaces 47a and the connector 23 within the receiving spaces 47a are exposed from side surfaces 24c of the packaging layers 24, thereby obtaining a plurality of interposer structures 5b each including a metal frame 47 and a connector 23.

In another embodiment, as shown in FIG. 5D', depending on the needs for product functions, during the singulation process S1, cutting can be performed along one of the sides of the metal frame 47 (e.g., along one of the support portions 471 of the metal frame 47) to simultaneously obtain a plurality of interposer structures 5b each including a metal frame 47 and a connector 23.

Figure 5E:
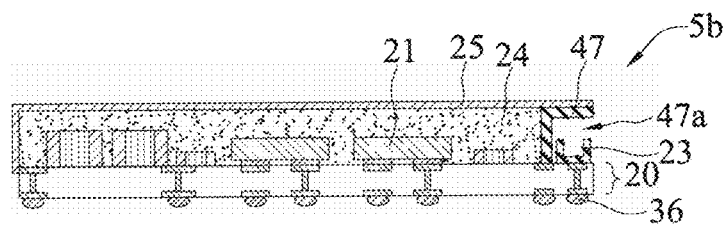

As shown in FIG. 5E, a shielding layer 25 for grounding the circuit layer 201 is formed on the packaging layer 24. The shielding layer 25 does not cover the connector 23 and the receiving space 47a of the metal frame 47.

Figure 5F:
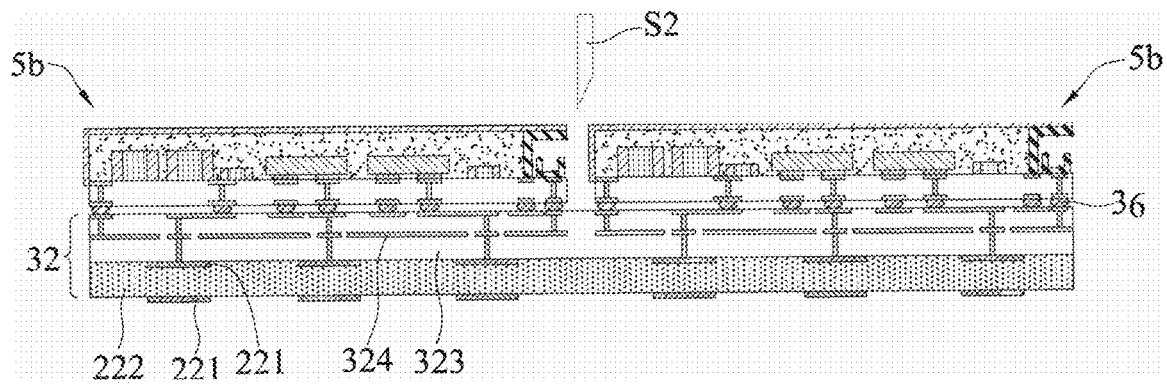
Figure 5G:
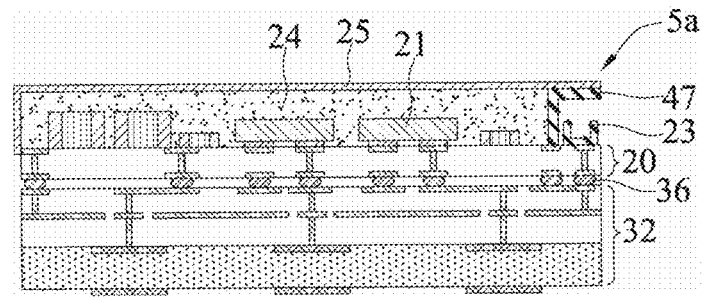

As shown in FIG. 5F, the plurality of interposer structures 5b are connected with an antenna module 32 via conductive components 36. Then, as shown in FIG. 5G, a second singulation process S2 is performed to obtain a packaging structure 5a of the present disclosure.

Figure 5H:
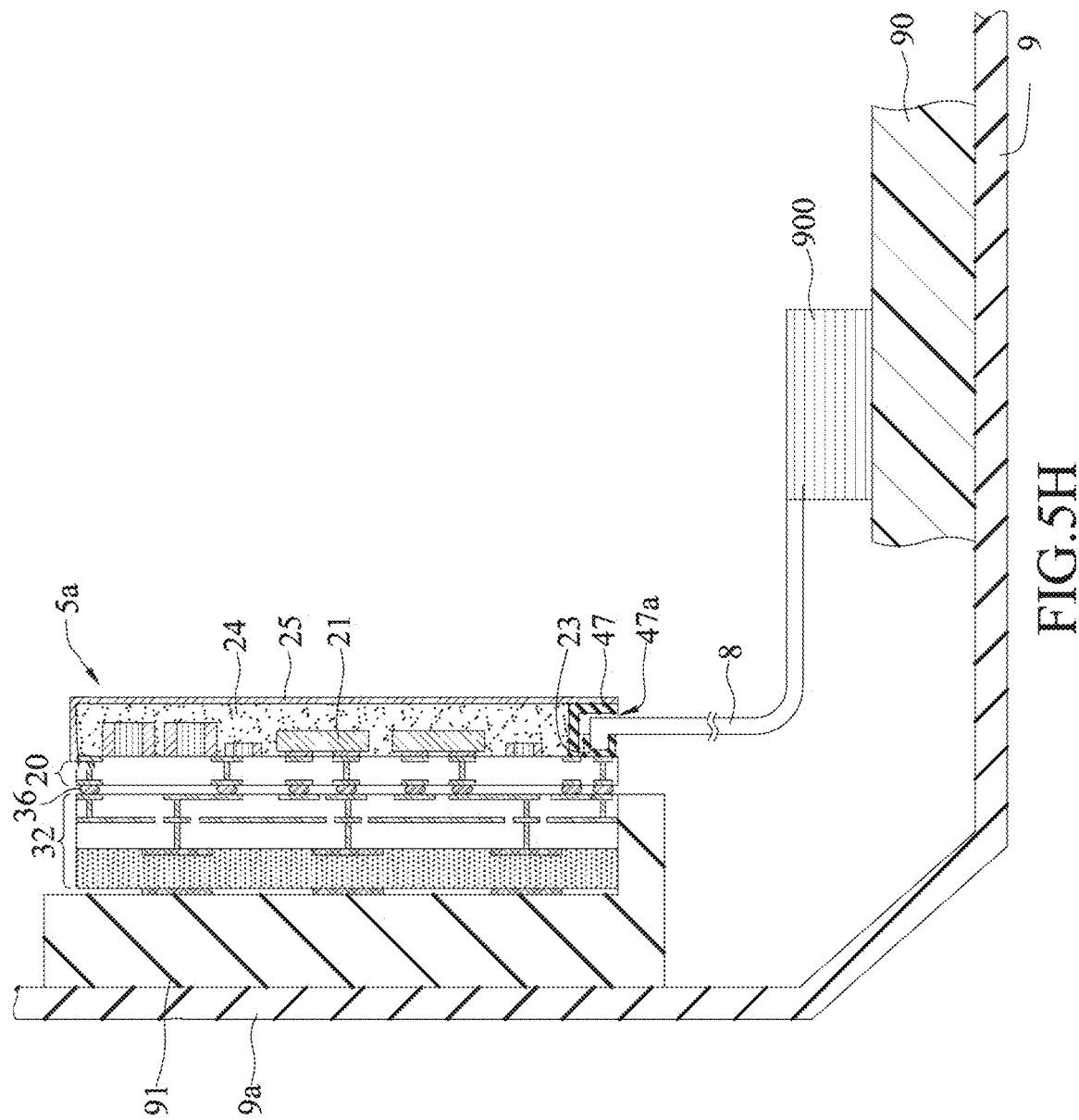
FIG. 5H is a schematic cross-sectional diagram of a subsequent application of the packaging structure of FIG. 5G.

In a subsequent application of the packaging structure 5a, as shown in FIG. 5H, the connector 23 is electrically connected to a connection port 900 of a motherboard 90 of an electronic product 9 (e.g., a smartphone) via a transmission cable or a transmission accessories 8 of a flexible circuit board, and the packaging structure 5a is integrated into the electronic product 9 through a support 91, and the antenna module 32 of the packaging structure 5a can be arranged in proximity to a housing 9a.

Therefore, the fabrication method of the present disclosure integrates the connector 23 onto the packaging structure 2, 2a, 3a, 4, 4a, 5a to enable the packaging structure 2, 2a, 3a, 4, 4a, 5a to be electrically connected to the motherboard 90 of the electronic product 9 (e.g., a smartphone). The packaging structure 2, 2a, 3a, 4, 4a, 5a can be placed near the housing 9a depending on the signal strength requirements. Compared to the prior art, the configuration of the packaging structure 2, 2a, 3a, 4, 4a, 5a is not limited by the location of the antenna module 22, 32, and thus the other components within the electronic product 9 are not constrained by space, allowing the electronic product 9 to satisfy the desired functions.

Moreover, since the connector 23 is directly disposed on the packaging structure 2, 2a, 3a, 4, 4a, 5a, the electrical energy provided by the motherboard 90 can be directly transmitted into the carrier 20 without going through other electrical transmission paths. As a result, the packaging structure 2, 2a, 3a, 4, 4a, 5a has a better electrical performance and reduced power loss.

Furthermore, by arranging the connector 23 onto the cutting path of the singulation process (or the first and second singulation processes), one side of the connector 23 can be exposed from the side surface 24c of the packaging layer 24 immediately after the singulation process. Thus, the fabrication method of the present disclosure saves both time and money. In other words, the packaging layer 24 can be directly formed on the entire surface of the carrier 20 without partial molding process as required in the prior art (prior art requires partial coverage, so customized molds are needed or excess packaging materials need to be removed).

Figure 6A:
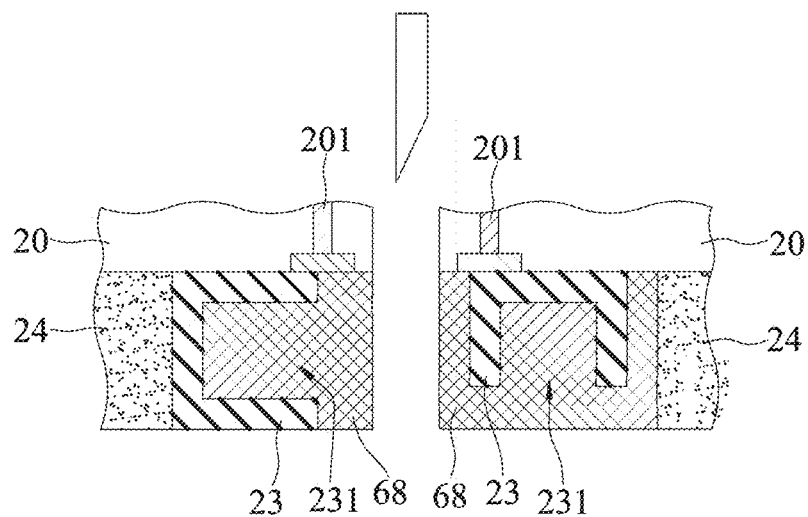
FIG. 6A is a portion of schematic cross-sectional diagram depicting a method for fabricating a packaging structure in accordance with a fifth embodiment of the present disclosure.
Figure 6B:
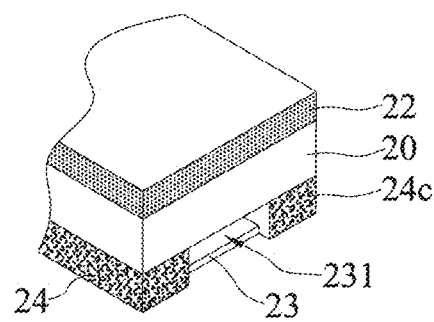
FIG. 6B is a portion of schematic three-dimensional diagram of FIG. 6A.
Figure 6B:
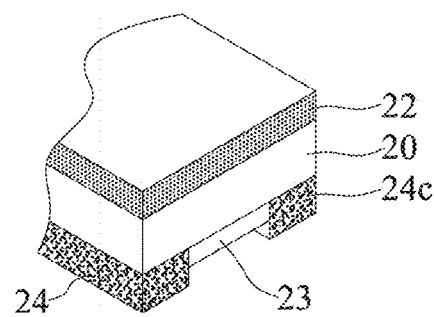

In addition, in other embodiments, the connectors 23 are not positioned onto the cutting path of the singulation process (or the first and second singulation processes) as shown in FIG. 6A. In this case, a resist layer 68, such as a photoresist or other removable temporary materials, is formed on the connectors 23 and ports 231 of the connectors 23, the electronic components 21 and the resist layer 68 are then encapsulated by a packaging layer 24. As such, the ports 231 of the connectors 23 can be exposed from the side surfaces 24c of the packaging layer 24 by removing the resist layer 68 after the singulation process, as shown in FIGS. 6B and 6B'. Thus, the need for a metal frame 47 can be eliminated as the arrangement of the resist layer 68 prevents the packaging layer 24 from covering the connector 23. However, both the resist layer 68 and the metal frame 47 can be used simultaneously depending on the needs.

The present disclosure further provides a packaging structure 2, 2a, 3a, 4, 4a, 5a, which includes a carrier 20, an antenna module 22, at least one electronic component 21, at least one connector 23, and a packaging layer 24 disposed on the carrier.

The packaging layer 24 encapsulates the electronic component 21 and the connector 23. A portion of the surface of the connector 23 is exposed from the packaging layer 24.

In an embodiment, the carrier 20 and the antenna module 22 combine to form an antenna board.

In an embodiment, the antenna module 22 can be stacked on the carrier 20 via at least one conductive components 36.

In an embodiment, the connector 23 has a port 231 exposed from a side surface 24c of the packaging layer 24.

In an embodiment, the packaging structure 4, 4a, 5a further includes a metal frame 47 buried in the packaging layer 24, the metal frame 47 is disposed on the carrier 20 and covers the connector 23. For example, the metal frame 47 forms a receiving space 47a for receiving the connector 23, and the receiving space 47a is in communication with the side surface 24c of the packaging layer 24.

In an embodiment, the packaging structure 2a, 3a, 4a, 5a further includes a shielding layer 25 formed on the packaging layer 24 and connected to ground.

In summary of the above, in the packaging structure of the present disclosure, the connector is packaged in the packaging layer with the port of the connector exposed to facilitate electrical connection with a motherboard of an electronic product. Therefore, the configuration of the packaging structure is not limited by the location of the antenna module, and the other components within the electronic product are thus not constrained by space, allowing the electronic product to satisfy the desired functions. Moreover, the electrical energy provided by the motherboard can be directly transmitted into the carrier without going through other electrical transmission paths. This enhances the electrical performance and reduces power loss of the packaging structure.

Furthermore, in the packaging structure of the present disclosure, by integrating the connector into the packaging layer, the antenna module can be positioned close to the housing depending on the signal strength requirements, which efficiently utilizes the internal space of the system end (or the electronic product). Also, packaging the entire surface is made possible, which significantly lowers the packaging cost and considerably reduces the volume of the packaging structure.

The above embodiments are merely provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A packaging structure, comprising:
    a carrier;
    an antenna module disposed on the carrier;
    an electronic component disposed on the carrier;
    a connector disposed on the carrier; and
    a packaging layer formed on the carrier and encapsulating the electronic component and the connector, and a portion of a surface of the connector being exposed from the packaging layer,
    wherein the connector has a port exposed from a side surface of the packaging layer, and
    wherein the port is connected to an external electric element.

2. The packaging structure of claim 1, wherein the carrier has a first side and a second side opposing the first side, and wherein the electronic component and the connector are disposed on the first side, and the antenna module is disposed on the second side.

3. The packaging structure of claim 1, wherein the antenna module and the carrier are combined to form an antenna board.

4. The packaging structure of claim 1, wherein the antenna module is stacked on the carrier via at least one conductive component.

5. The packaging structure of claim 1, further comprising a metal frame buried in the packaging layer, wherein the metal frame is disposed on the carrier and covers the connector.

6. The packaging structure of claim 5, wherein the metal frame is formed with a receiving space for receiving the connector, and the receiving space is in communication with a side surface of the packaging layer.

7. The packaging structure of claim 1, further comprising a shielding layer formed on the packaging layer and connected to ground.

8. A method for fabricating a packaging structure, comprising:
    providing a carrier configured with an electronic component;
    disposing a connector on the carrier; and
    encapsulating the electronic component and the connector by a packaging layer and allowing a portion of a surface of the connector to be exposed from the packaging layer,
    wherein the carrier is further configured with an antenna module, wherein the connector has a port exposed from a side surface of the packaging layer, and wherein the port is connected to an external electric element.

9. The method of claim 8, wherein the carrier has a first side and a second side opposing the first side, and wherein the electronic component and the connector are disposed on the first side, and the antenna module is disposed on the second side.

10. The method of claim 8, wherein the antenna module and the carrier are combined to form an antenna board.

11. The method of claim 8, wherein the antenna module is stacked on the carrier via at least one conductive component.

12. The method of claim 8, further comprising disposing a plurality of connectors on the carrier, wherein the port of each of the connectors is connected to each other, and wherein after the packaging layer encapsulates the electronic component and the plurality of connectors, a singulation process is performed to cut the packaging layer and separate the plurality of connectors, the port of each of the connectors is exposed from the side surface of the packaging layer.

13. The method of claim 8, further comprising forming a resist layer on the port of the connector before the electronic component and the connector being encapsulated by the packaging layer, wherein after a singulation process is performed, the resist layer is removed to expose the port from the side surface of the packaging layer.

14. The method of claim 8, wherein the port of the connector faces away from the carrier, and before forming the packaging layer, the port is covered with a resist layer or a metal frame.

15. The method of claim 8, further comprising forming a metal frame on the carrier, wherein the metal frame covers the connector and is encapsulated by the packaging layer.

16. The method of claim 15, wherein the metal frame is formed with a receiving space for receiving the connector, and the receiving space is in communication with a side surface of the packaging layer.

17. The method of claim 16, wherein the receiving space is used as a cutting path, and a singulation process is performed along the cutting path to simultaneously expose the connector and the receiving space from the side surface of the packaging layer.

18. The method of claim 16, wherein the metal frame is supported on the carrier by a support portion, and the connector is located in the support portion, and then a singulation process is performed to cut along the support portion of the metal frame to simultaneously expose the connector and the receiving space from the side surface of the packaging layer.

19. The method of claim 8, further comprising forming a shielding layer on the packaging layer and connecting the shielding layer to ground.

\* \* \* \* \*